US012683038B2

(12) United States Patent
Nakayama

(10) Patent No.: US 12,683,038 B2
(45) Date of Patent: Jul. 14, 2026

(54) JUMPER CHIP COMPONENT

(71) Applicant: Panasonic Intellectual Property Management Co., Ltd., Osaka (JP)

(72) Inventor: Shogo Nakayama, Fukui (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 168 days.

(21) Appl. No.: 18/570,010

(22) PCT Filed: Jun. 16, 2022

(86) PCT No.: PCT/JP2022/024097
§ 371 (c)(1),
(2) Date: Dec. 13, 2023

(87) PCT Pub. No.: WO2022/270399
PCT Pub. Date: Dec. 29, 2022

(65) Prior Publication Data
US 2024/0274314 A1 Aug. 15, 2024

(30) Foreign Application Priority Data

Jun. 24, 2021 (JP) .................................. 2021-105188

(51) Int. Cl.
*H01B 5/14* (2006.01)
*H05K 1/181* (2026.01)

(52) U.S. Cl.
CPC .............. *H01B 5/14* (2013.01); *H05K 1/181* (2013.01); *H05K 2201/10363* (2013.01)

(58) Field of Classification Search
CPC ........................................................ H01B 5/14
USPC ......................................................... 174/257
See application file for complete search history.

(56) References Cited

FOREIGN PATENT DOCUMENTS

| | | | |
|---|---|---|---|
| JP | S49-092940 A | | 12/1974 |
| JP | 2008 204684 | * | 2/2007 |
| JP | 2007-188971 A | | 7/2007 |
| JP | 2008-204684 A | | 9/2008 |
| JP | 2017-220596 A | | 12/2017 |
| JP | 2021-022667 A | | 2/2021 |

OTHER PUBLICATIONS

International Search Report received in International Application No. PCT/JP2022/024097, dated Sep. 6, 2022.

* cited by examiner

*Primary Examiner* — Stanley Tso
(74) *Attorney, Agent, or Firm* — Rimon P.C.

(57) ABSTRACT

A jumper chip component is designed to be mounted onto a printed board. The jumper chip component includes a base, a conductor, and an end face electrode. The base has electrical insulation properties. The conductor is disposed on a lower surface, facing the printed board, of the base to extend from a first end of the lower surface through a second end, facing the first end, of the lower surface. The end face electrode is disposed on at least a side surface of the base and arranged to be electrically connected to the conductor. The jumper chip component has one surface facing the printed board. The one surface is a flat surface.

9 Claims, 5 Drawing Sheets

*FIG. 1*

*FIG. 3A*
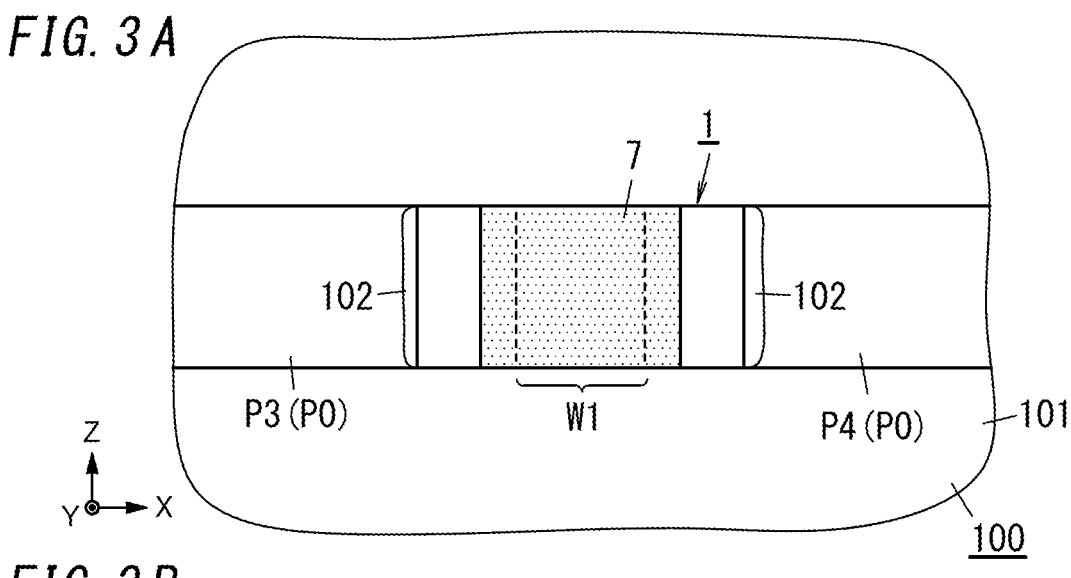
*FIG. 3B*
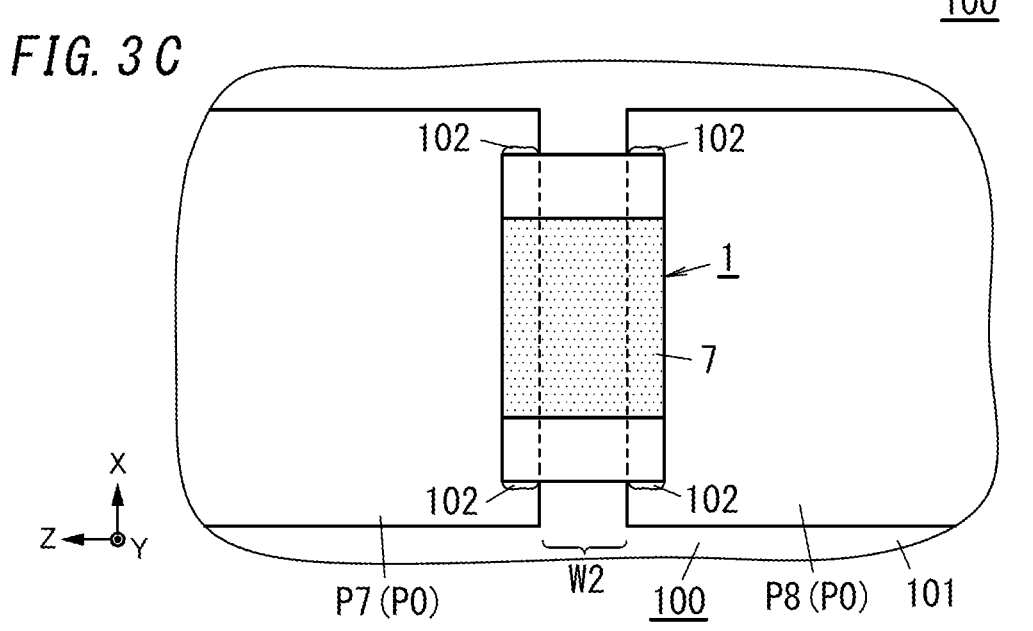
*FIG. 3C*

*FIG. 4*

JUMPER CHIP COMPONENT

CROSS-REFERENCE TO RELATED APPLICATIONS

This application is the U.S. National Phase under 35 U.S.C. § 371 of International Application No. PCT/JP2022/024097, filed on Jun. 16, 2022, which claims the benefit of foreign priority to Japanese Patent Application No. 2021-105188 filed on Jun. 24, 2021, the entire contents of each of which are hereby incorporated by reference.

TECHNICAL FIELD

The present disclosure generally relates to a jumper chip component, and more particularly relates to a jumper chip component to be mounted on a printed board.

BACKGROUND ART

Patent Literature 1 discloses a jumper chip (component). The jumper chip includes an insulating base, a conductor formed on the upper surface of the insulating base, and a protective coating that covers the conductor entirely but both end regions thereof. The jumper chip further includes a pair of upper surface electrodes, which are formed to cover the end regions, not covered with the protective coating, of the conductor and arranged to partially overcoat the conductor. Patent Literature 1 describes that providing the upper surface electrodes made of a material containing palladium may prevent, even if a sulfurating atmosphere enters the jumper chip through the boundary between the protective coating and plating, the conductor from being sulfurated.

CITATION LIST

Patent Literature

Patent Literature 1: JP 2007-188971 A

SUMMARY OF INVENTION

Meanwhile, the jumper chip component preferably has its resistance value further reduced to be easily mounted even onto a current path through which a large amount of current flows.

In view of the foregoing background, it is therefore an object of the present disclosure to provide a jumper chip component that may have its resistance value reduced.

A jumper chip component according to an aspect of the present disclosure is designed to be mounted onto a printed board. The jumper chip component includes a base, a conductor, and an end face electrode. The base has electrical insulation properties. The conductor is disposed on a lower surface of the base to extend from a first end of the lower surface through a second end, facing the first end, of the lower surface. The lower surface faces the printed board. The end face electrode is disposed on at least a side surface of the base and arranged to be electrically connected to the conductor. The jumper chip component has one surface facing the printed board. The one surface is a flat surface.

A jumper chip component according to another aspect of the present disclosure is designed to be mounted onto a printed board. The jumper chip component includes a base, a conductor, an end face electrode, and a step providing electrode. The base has electrical insulation properties. The conductor is disposed on a lower surface of the base to extend from a first end of the lower surface through a second end, facing the first end, of the lower surface. The lower surface faces the printed board. The end face electrode is disposed on at least a side surface of the base and arranged to be electrically connected to the conductor. The step providing electrode is arranged to provide a step. The jumper chip component has one surface facing the printed board. The one surface has a recess in a central area thereof. The recess is recessed toward the conductor. The recess is provided by the step.

BRIEF DESCRIPTION OF DRAWINGS

FIG. 1 is a schematic cross-sectional perspective view of a jumper chip component according to a first embodiment;

FIG. 3A is a plan view illustrating a third exemplary use of the jumper chip component;

FIG. 3B is a plan view illustrating a fourth exemplary use of the jumper chip component;

FIG. 3C is a plan view illustrating a fifth exemplary use of the jumper chip component;

FIG. 4 is a schematic cross-sectional perspective view of a jumper chip component according to a second embodiment.

DESCRIPTION OF EMBODIMENTS

First Embodiment

Figure 2:
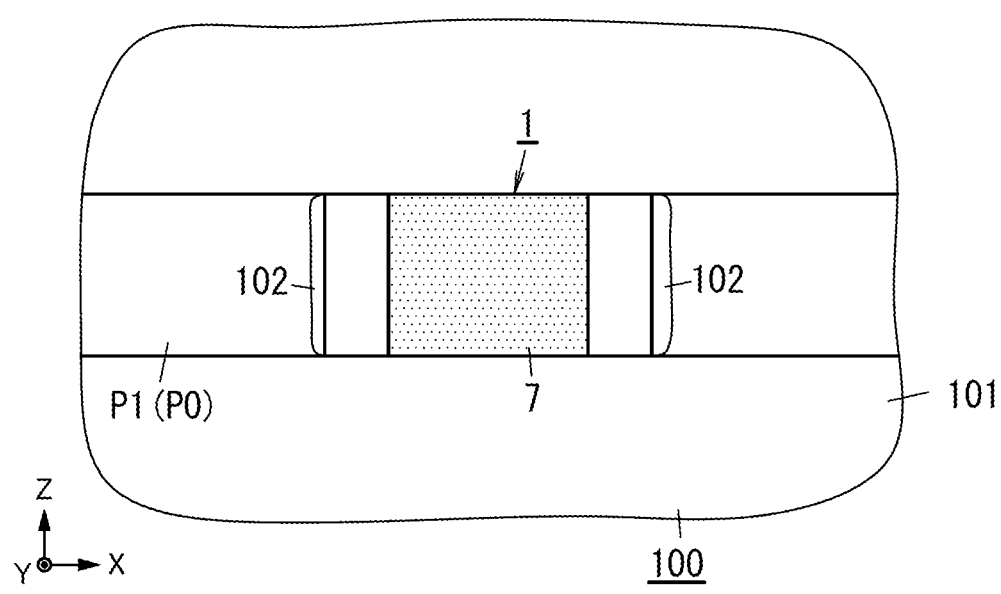
FIG. 2A is a plan view illustrating a first exemplary use of the jumper chip component.
FIG. 2B is a plan view illustrating a second exemplary use of the jumper chip component.
Figure 2:
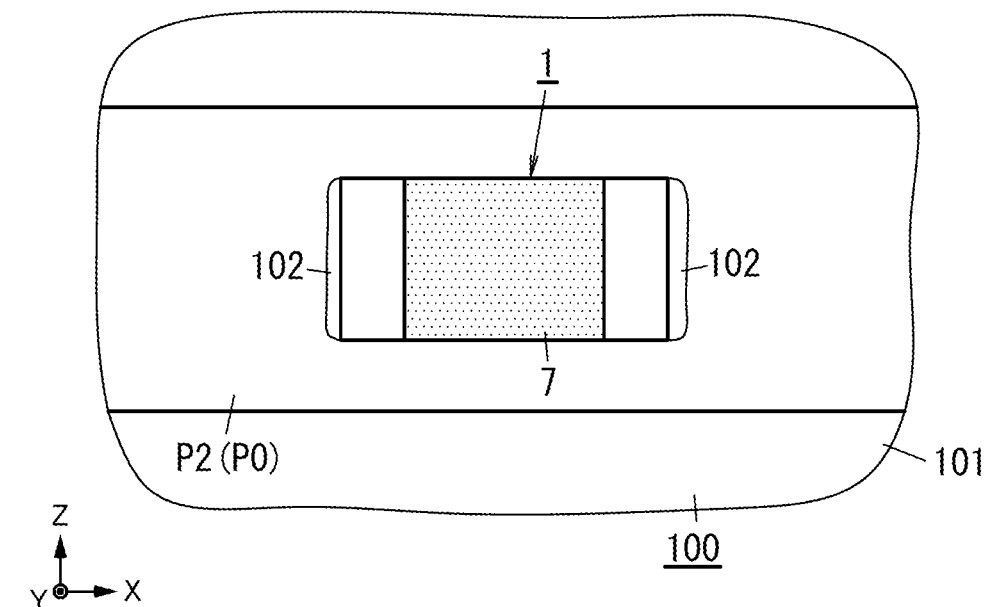

A jumper chip component 1 according to a first exemplary embodiment will now be described with reference to FIGS. 1-3C. The drawings to be referred to in the following description of the first embodiment and a second embodiment (to be described later) are all schematic representations. Thus, the ratio of the dimensions (including thicknesses) of respective constituent elements illustrated on the drawings does not always reflect their actual dimensional ratio.

(1) Overview

First, an overview of the jumper chip component 1 according to this embodiment will be described.

The jumper chip component 1 according to this embodiment is designed to be mounted on a printed board 100 (refer to FIGS. 2A-3C). The jumper chip component 1 is configured to be bondable to a patterned conductor P0 (land) formed on the printed board 100. As used herein, the printed board 100 refers to a printed wiring board on which conductor wiring (patterned conductor P0) is formed on the surface and inside of a plate-shaped insulating substrate 101 made of an insulator. On the printed board 100, not only the jumper chip component 1 but also various types of electronic components such as other chip components and lead components may be mounted. The various types of electronic components mounted on the printed board 100 and the patterned conductor P0 may form an electric circuit for power systems such as a power supply circuit or a driver circuit for a motor, for example, or an electric circuit for signal systems such as a control circuit. The jumper chip component 1 may be bonded via solder, for example, onto the patterned conductor P0 formed on the insulating substrate 101 (refer to a solder fillet 102 shown in FIGS. 2A-3C).

Figure 1:
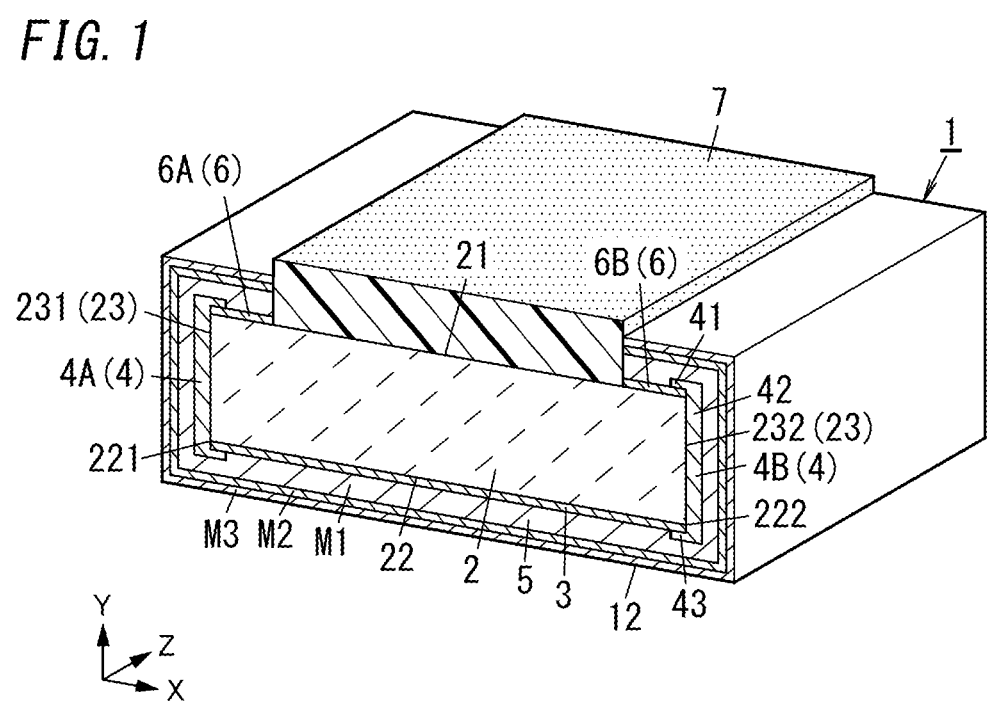

As shown in FIG. 1, the jumper chip component 1 includes a base 2, a conductor 3, and an end face electrode 4. The base 2 has electrical insulation properties. The conductor 3 is disposed on the lower surface 22 of the base 2 to extend from a first end 221 of the lower surface 22 through a second end 222 thereof that faces the first end 221. The lower surface 22 faces the printed board 100. The end face electrode 4 is disposed on at least a side surface 23 of the base 2 and arranged to be electrically connected to the conductor 3. One surface 12, facing the printed board 100, of the jumper chip component 1 is a flat surface.

In this case, if the conductor were provided on the upper surface, not the lower surface, of the base as in the jumper chip of Patent Literature 1, then an electric current would flow through the conductor on the upper surface via the end face electrodes. On the other hand, the conductor 3 according to this embodiment is disposed on the lower surface 22 of the base 2 to extend from the first end 221 of the lower surface 22 through the second end 222 thereof. Thus, this makes it easier, in the jumper chip component 1 as a whole, to shorten the length of the current path by the end face electrode 4. Consequently, the jumper chip component 1 achieves the advantage of contributing to reducing the resistance value. That is why it is easier to mount the jumper chip component 1 even on a current path, through which a large amount of current flows, as in onboard motor cables, for example. In particular, the one surface 12 of the jumper chip component 1 is a flat surface, thus contributing to reducing the height of the jumper chip component 1 with respect to the printed board 100.

(2) Details

Next, the jumper chip component 1 according to this embodiment will be described in further detail with reference to FIGS. 1-3C.

(2.1) Overall Configuration

FIG. 1 is a schematic cross-sectional perspective view of the jumper chip component 1 according to this embodiment.

In the following description, the jumper chip component 1 will be described with three axes that intersect at right angles with each other (namely, an X-axis, aY-axis, and a Z-axis) set as shown in FIG. 1. In this description, an axis aligned with the longitudinal axis of the elongate jumper chip component 1 is defined to be the X-axis, an axis aligned with the thickness axis thereof is defined to be the Y-axis, and an axis aligned with the width axis of the jumper chip component 1 is defined to be the Z-axis. In the following description, a direction aligned with the Y-axis direction will be hereinafter simply referred to as an "upward/downward direction" with the positive side of the Y-axis referred to as "upward" and the negative side of the Y-axis referred to as "downward."

Note that all of these X-, Y-, and Z-axes are virtual axes and the arrows on the drawings to indicate the X, Y and Z axes are just shown there for the purpose of description and are all insubstantial ones. It should also be noted that these directions are not shown there to limit the directions in which the jumper chip component 1 is supposed to be used.

The jumper chip component 1 is configured to be bondable onto the patterned conductor P0 (land) formed on the printed board 100. The jumper chip component 1 is a generally compressed, chip-shaped component. The one surface 12 (back surface), facing the printed board 100, of the jumper chip component 1 is a flat surface. In this embodiment, the one surface 12 of the jumper chip component 1 corresponds to the lower surface of a third plating layer M3 (to be described later).

The jumper chip component 1 includes the base 2, the conductor 3, the end face electrode 4, a first plating layer M1, an upper surface electrode 6, a protective coating 7, a second plating layer M2, and the third plating layer M3. In FIGS. 1-3C, the surface of the protective coating 7 is indicated by dotted hatch.

The base 2 has electrical insulation properties. The base 2 may be, for example, a ceramic substrate. The base 2 has the shape of a rectangular plate and is a rectangular parallelepiped which is compressed in the Y-axis direction and is elongate in the X-axis direction. That is to say, the thickness axis of the base 2 is parallel to the Y-axis. The base 2 has an upper surface 21 (first surface) and a lower surface 22 (second surface). The upper surface 21 and the lower surface 22 are both parallel to an X-Z plane.

The lower surface 22 of the base 2 is a surface that will face the printed board 100 when the jumper chip component 1 is mounted on the printed board 100. That is to say, the lower surface 22 faces the printed board 100. Nevertheless, in this embodiment, the lower surface 22 faces the printed board 100 with the conductor 3 and the first to third plating layers M1-M3 interposed between the lower surface 22 and the printed board 100.

In addition, the base 2 also has side surfaces 23 which are parallel to aY-Z plane. The side surfaces 23 include a first side surface 231 on the negative side of the X-axis and a second side surface 232 on the positive side of the X-axis.

The upper surface 21, the lower surface 22, the first side surface 231, and the second side surface 232 are covered with the conductor 3 (lower surface electrode), the upper surface electrode 6, the end face electrode 4, the protective coating 7, and the first to third plating layers M1-M3, as will be described later, and therefore, are not exposed to the outside. Meanwhile, both side surfaces of the base 2 in the Z-axis direction are not covered with any of these electrodes or plating layers but are exposed to the outside. However, this is only an example and should not be construed as limiting. Alternatively, these side surfaces of the base 2 in the Z-axis direction may also be covered with the electrodes or the plating layers.

The conductor 3 (lower surface electrode) has the shape of a rectangular sheet and is provided directly on the lower surface 22 of the base 2. The conductor 3 may be formed as a thin sheet by, for example, printing and firing a conductive paste including silver as a main component. Alternatively, the conductor 3 may also be formed by applying and curing a resin silver paste. The conductor 3 is disposed on the lower surface 22 of the base 2 to extend from the first end 221 thereof (on the negative side of the X-axis) through the second end 222 (on the positive side of the X-axis) thereof that faces the first end 221. For example, the conductor 3 may have substantially the same shape and approximately the same area as the lower surface 22 when viewed along the Y-axis. That is to say, in the example shown in FIG. 1, the conductor 3 is disposed to cover the lower surface 22 of the base 2 almost entirely from the left end of the lower surface 22 through the right end thereof.

The upper surface electrode 6 is disposed on at least a part of the upper surface 21, opposite from the lower surface 22, of the base 2. In this embodiment, the upper surface electrode 6 includes a pair of electrodes 6A, 6B. Each of these electrodes 6A, 6B has the shape of a rectangular strip which is elongate in the Z-axis direction. These electrodes 6A, 6B are provided directly on the upper surface 21 of the base 2 to cover one end portion of the upper surface 21 of the base 2 on the negative side of the X-axis and the other end portion of the upper surface 21 of the base 2 on the positive side of the X-axis, respectively.

The upper surface electrode 6 may be formed as a thin sheet by, for example, printing and firing a conductive paste including silver as a main component. Alternatively, the upper surface electrode 6 may also be formed by applying and curing a resin silver paste. The material for the upper surface electrode 6 may be the same as the material for the conductor 3.

In this embodiment, the electric current flows dominantly through the conductor 3 (lower surface electrode). The upper surface electrode 6 is less likely to serve as a current path than the conductor 3 is. Nevertheless, providing the upper surface electrode 6 may make the jumper chip component 1 significantly more resistant to stress after the jumper chip component 1 has been mounted on the printed board 100. In addition, providing the upper surface electrode 6 increases the adhesive strength of the first to third plating layers M1-M3 to the conductor 3 as well. Furthermore, the upper surface electrode 6 also contributes to reducing the resistance value of the jumper chip component 1 as a whole.

The end face electrode 4 is disposed on at least the side surfaces 23 of the base 2 and arranged to be electrically connected to the conductor 3. In this embodiment, the end face electrode 4 is provided directly on the side surfaces 23 of the base 2 and arranged to be electrically connected to the conductor 3 and the upper surface electrode 6.

Specifically, the end face electrode 4 includes a pair of electrodes 4A, 4B. Each of these electrodes 4A, 4B is elongate in the Z-axis direction.

Each of these electrodes 4A, 4B has a generally U-shaped cross section as taken along an X-Y plane. Each of these electrodes 4A, 4B has an upper part 41 facing a corresponding one of the electrodes 6A, 6B. In addition, each of these electrodes 4A, 4B also has a middle part 42 facing a corresponding one of the first and second side surfaces 231, 232 of the base 2. Furthermore, each of these electrodes 4A, 4B further has a lower part 43 facing a corresponding one of an edge portion of the conductor 3 on the negative side of the X-axis or an edge portion of the conductor 3 on the positive side of the X-axis. Each of these electrodes 4A, 4B forms a generally U shape by connecting the upper part 41, the middle part 42, and the lower part 43 together to form an integral member. The electrode 4A is arranged to surround the edge portion of the electrode 6A on the negative side of the X-axis, the first side surface 231 of the base 2, and the edge portion of the conductor 3 on the negative side of the X-axis. The electrode 4B is arranged to surround the edge portion of the electrode 6B on the positive side of the X-axis, the second side surface 232 of the base 2, and the edge portion of the conductor 3 on the positive side of the X-axis.

The end face electrode 4 may be formed as a thin sheet by, for example, printing and firing a conductive paste including silver as a main component. Alternatively, the end face electrode 4 may also be formed by applying and curing a resin silver paste. The material for the end face electrode 4 may be the same as the material for the conductor 3.

In this embodiment, the electric current flows dominantly through the conductor 3. The end face electrode 4 is less likely to serve as a current path than the conductor 3 is. Nevertheless, providing the end face electrode 4 may make the jumper chip component 1 significantly more resistant to stress after the jumper chip component 1 has been mounted on the printed board 100. In addition, providing the end face electrode 4 increases the adhesive strength of the first to third plating layers M1-M3 to the conductor 3 as well. Furthermore, the end face electrode 4 also contributes to reducing the resistance value of the jumper chip component 1 as a whole.

The protective coating 7 at least partially covers the upper surface 21, opposite from the lower surface 22, of the base 2. In this embodiment, the protective coating 7 is provided directly on the upper surface 21 of the base 2 to cover the upper surface 21 of the base 2 entirely but an end portion thereof on the positive side of the X-axis and an end portion thereof on the negative side of the X-axis. In other words, the protective coating 7 is provided on the upper surface 21 of the base 2 to be interposed between, and in contact with, the electrodes 6A, 6B on the upper surface 21 of the base 2. Alternatively, the protective coating 7 may also be provided on the upper surface 21 of the base 2 to partially overcoat the electrodes 6A, 6B. The protective coating 7 may be made of an epoxy resin, for example.

Providing the protective coating 7 makes it easier to distinguish the upside of the jumper chip component 1 from the downside thereof in, for example, the process step of mounting the jumper chip component 1, thus contributing to increasing the productivity. In this case, the upside and downside of the jumper chip component 1 may be distinguished from each other not only by visual inspection by a human being but also by a production management system that checks appearance images generated by having the jumper chip component 1 shot by an image capture device (camera) as well.

In the process step of mounting the jumper chip component 1, the jumper chip component 1 may be picked by suction onto a tip nozzle of a chip mounter and then mounted on the printed board 100. In that case, the tip nozzle will come into contact with the upper surface of the jumper chip component 1 a number of times to be gradually worn out. Providing the protective coating 7 may reduce the wear of the tip nozzle.

The first plating layer M1 contains Cu (copper) and has electrical conductivity. The first plating layer M1 is a thin film layer. The first plating layer M1 corresponds to a copper plating layer 5 and covers the conductor 3 at least partially. In this embodiment, the first plating layer M1 is disposed to cover the surface of the electrodes 6A, 6B, the surface of the electrodes 4A, 4B, and the surface of the conductor 3 almost entirely. Nevertheless, the first plating layer M1 is disposed not to covert the protective coating 7.

The first plating layer M1 may contain not only Cu as a main component but also other additional components as well. The first plating layer M1 may be made of a copper alloy, for example. Alternatively, the first plating layer M1 may contain, for example, Au (gold) or Ag (silver) as a main component thereof instead of Cu. For example, the first plating layer M1 may also be made of a silver alloy. That is to say, the first plating layer M1 may also be a gold plating layer or a silver plating layer.

In this embodiment, providing the first plating layer M1 may increase the thickness of the part serving as a current path (i.e., the part including the first plating layer M1 and the conductor 3) in the Y-axis direction, thus contributing to reducing the resistance value of the jumper chip component 1.

The second plating layer M2 contains Ni (nickel) and has electrical conductivity. The second plating layer M2 is a thin film layer. The second plating layer M2 corresponds to a nickel plating layer and covers the first plating layer M1 at least partially (e.g., covers the outer surface of the first plating layer M1 almost entirely in this embodiment). The second plating layer M2 is provided directly on the outer surface of the first plating layer M1. The second plating layer M2 may contain not only Ni as a main component thereof but also other additional components as well.

The third plating layer M3 contains Sn (tin) and has electrical conductivity. The third plating layer M3 is a thin film layer. The third plating layer M3 corresponds to a tin plating layer and covers the second plating layer M2 at least partially (e.g., covers the outer surface of the second plating layer M2 almost entirely in this embodiment). The third plating layer M3 is provided directly on the outer surface of the second plating layer M2. The third plating layer M3 may contain not only Sn (tin) as a main component thereof but also other additional components as well.

The jumper chip component 1 with such a configuration may be fabricated by forming, for example, the conductor 3, the upper surface electrode 6, the end face electrode 4, the protective coating 7, the first plating layer M1, the second plating layer M2, and the third plating layer M3 in this order with respect to the base 2. However, this is only an exemplary order of formation and should not be construed as limiting.

The jumper chip component 1 with such a configuration may reduce the resistance value to as low as 1 mΩ or less, for example.

If the conductor were provided on the upper surface, not the lower surface, of the base as in the jumper chip of Patent Literature 1, then an electric current would flow through the conductor on the upper surface via the end face electrode. Specifically, if the known configuration were applied to the jumper chip component 1 according to this embodiment, then the electric current would flow upward through one of the electrodes 4A, 4B of the end face electrode 4, pass through the conductor provided on the upper surface of the base, and then flow downward through the other of the electrodes 4A, 4B. This would increase the length of the current path because the electric current should flow up and down through the electrodes 4A, 4B.

On the other hand, the conductor 3 according to this embodiment is disposed on the lower surface 22 of the base 2 to extend from the first end 221 of the lower surface 22 through the second end 222 thereof. Thus, this makes it easier, in the jumper chip component 1 as a whole, to shorten the length of the current path by the end face electrode 4. Consequently, the jumper chip component 1 achieves the advantage of contributing to reducing the resistance value. Reducing the resistance value enables reducing the generation of heat as the Joule heat even when a large amount of current is applied, thus allowing a larger amount of current to flow. That is why it is easier to mount the jumper chip component 1 even on a current path, through which a large amount of current flows, as in onboard motor cables, for example.

Furthermore, the one surface 12 of the jumper chip component 1 is a flat surface, thus contributing to reducing the height of the jumper chip component 1 with respect to the printed board 100.

Increasing the thickness of the copper plating layer 5 (first plating layer M1) enables further reducing the resistance value. Considering the permissible amount of current, the thickness of the plating layer, and the cost of forming the plating layer, the copper plating layer 5 preferably has a thickness falling within the range from 10 μm to 50 μm, for example.

(2.2) Exemplary Uses

Next, exemplary uses of the jumper chip component 1 will be described with reference to FIGS. 2A-3C. The printed board 100 shown in FIGS. 2A-3C has a thickness in the Y-axis direction. The printed board 100 has a patterned conductor P0 to which the jumper chip component 1 may be bonded.

More specifically, the printed board 100 may be, for example, a single-sided printed wiring board including an insulating substrate 101 (base material) and the patterned conductor P0 (printed wiring). However, this is only an example and should not be construed as limiting. Alternatively, the printed board 100 may also be a double-sided printed wiring board.

The insulating substrate 101 has electrical insulation properties. The insulating substrate 101 may be, for example, a glass epoxy substrate.

The patterned conductor P0 is formed on one side (on the positive side of the Y-axis) of the insulating substrate 101. The patterned conductor P0 may electrically connect together a plurality of electronic components (circuit components) mounted on the printed board 100 and may form a circuit along with the plurality of electronic components.

In this embodiment, the material for the patterned conductor P0 is supposed to be copper (copper foil). Alternatively, the material for the patterned conductor P0 may also be, for example, aluminum or stainless steel. The thickness of the patterned conductor P0 is supposed to be equal to or greater than 18 μm and equal to or less than 100 μm in this embodiment. However, this is only an example and should not be construed as limiting. The printed board 100 may be obtained by patterning a sheet of copper foil of a metal-clad laminate into a desired patterned conductor P0 by photo-etching process. The patterned conductor P0 may be partially covered with a resist layer.

In this embodiment, the jumper chip component 1 is surface mounted by soldering onto the patterned conductor P0 formed on the printed board 100. Specifically, with at least part of the one surface 12 (back surface) facing the surface of the patterned conductor P0, both end portions of the third plating layer M3 in the X-axis direction are bonded via solder onto the patterned conductor P0. The number of the jumper chip components 1 to be mounted onto the single printed board 100 is not limited to any particular number.

The jumper chip component 1, as well as the other components to be mounted (such as circuit components), may be mounted onto the patterned conductor P0 either by a parts mounting machine (chip mounter) or by human hands using tweezers, for example.

<First Exemplary Use>

FIG. 2A illustrates a first exemplary use of the jumper chip component 1. In FIG. 2A, a first patterned conductor P1 is illustrated as the patterned conductor P0.

The first patterned conductor P1 is formed to have its electrical path aligned with the X-axis. The width of the jumper chip component 1 is approximately equal to the width of the first patterned conductor P1. The jumper chip component 1 is disposed on the first patterned conductor P1 such that the longitudinal axis of the jumper chip component 1 is aligned with the electrical path of the first patterned conductor P1 (i.e., aligned with X-axis direction). The jumper chip component 1 is bonded via solder onto the first patterned conductor P1 at both longitudinal ends thereof (see solder fillets 102) with the one surface 12 (back surface) thereof making substantially plane contact with the surface of the first patterned conductor PT.

<Second Exemplary Use>

FIG. 2B illustrates a second exemplary use of the jumper chip component 1. In FIG. 2B, a second patterned conductor P2 is illustrated as the patterned conductor P0.

The second patterned conductor P2 is formed to have its electrical path aligned with the X-axis. The width of the jumper chip component 1 is less than the width of the second patterned conductor P2. The jumper chip component 1 is disposed in a middle part of the width of the second patterned conductor P2 such that the longitudinal axis of the jumper chip component 1 is aligned with the electrical path of the second patterned conductor P2 (i.e., aligned with X-axis direction). The jumper chip component 1 is bonded via solder onto the second patterned conductor P2 at both longitudinal ends thereof (see solder fillets 102) with the one surface 12 (back surface) thereof making substantially plane contact with the surface of the second patterned conductor P2.

<Third Exemplary Use>

FIG. 3A illustrates a third exemplary use of the jumper chip component 1. In FIG. 3A, a third patterned conductor P3 and a fourth patterned conductor P4 are illustrated as the patterned conductors P0.

The third patterned conductor P3 and the fourth patterned conductor P4 are formed to have their respective electrical paths aligned with the X-axis and to make their respective end portions face each other with a predetermined gap W1 left between themselves. The respective widths of the third patterned conductor P3 and the fourth patterned conductor P4 are approximately equal to each other. The width of the jumper chip component 1 is approximately equal to the respective widths of the third patterned conductor P3 and the fourth patterned conductor P4.

The jumper chip component 1 is disposed such that the longitudinal axis of the jumper chip component 1 is aligned with the respective electrical paths of the third patterned conductor P3 and the fourth patterned conductor P4 (i.e., aligned with X-axis direction) and that the jumper chip component 1 extends across the gap W1. The jumper chip component 1 is bonded via solder onto the respective facing end portions of the third patterned conductor P3 and the fourth patterned conductor P4 at both longitudinal ends thereof (see solder fillets 102).

As a result, the third patterned conductor P3 and the fourth patterned conductor P4 are electrically connected to each other via the jumper chip component 1.

<Fourth Exemplary Use>

FIG. 3B illustrates a fourth exemplary use of the jumper chip component 1. In FIG. 3B, a fifth patterned conductor P5 and a sixth patterned conductor P6 are illustrated as the patterned conductors P0.

The fifth patterned conductor P5 and the sixth patterned conductor P6 are formed to have their respective electrical paths aligned with the X-axis and to make their respective end portions face each other with a predetermined gap W1 left between themselves. The respective widths of the fifth patterned conductor P5 and the sixth patterned conductor P6 are approximately equal to each other. The width of the jumper chip component 1 is less than the respective widths of the fifth patterned conductor P5 and the sixth patterned conductor P6.

The jumper chip component 1 is disposed in respective middle parts along the width axis of these patterned conductors P0 such that the longitudinal axis of the jumper chip component 1 is aligned with the respective electrical paths of the fifth patterned conductor P5 and the sixth patterned conductor P6 (i.e., aligned with X-axis direction) and that the jumper chip component 1 extends across the gap W1. The jumper chip component 1 is bonded via solder onto the respective facing end portions of the fifth patterned conductor P5 and the sixth patterned conductor P6 at both longitudinal ends thereof (see solder fillets 102).

As a result, the fifth patterned conductor P5 and the sixth patterned conductor P6 are electrically connected to each other via the jumper chip component 1.

<Fifth Exemplary Use>

FIG. 3C illustrates a fifth exemplary use of the jumper chip component 1. In FIG. 3C, a seventh patterned conductor P7 and an eighth patterned conductor P8 are illustrated as the patterned conductors P0.

The seventh patterned conductor P7 and the eighth patterned conductor P8 are formed to have their respective electrical paths aligned with the Z-axis and to make their respective end portions face each other with a predetermined gap W2 left between themselves. The respective widths of the seventh patterned conductor P7 and the eighth patterned conductor P8 are approximately equal to each other. The length of the jumper chip component 1 along the longitudinal axis thereof (i.e., in the X-axis direction) is less than the respective widths of the seventh patterned conductor P7 and the eighth patterned conductor P8.

The jumper chip component 1 is disposed in respective middle parts along the width axis of these patterned conductors P0 such that the longitudinal axis of the jumper chip component 1 intersects (e.g., at right angles in this example) with the respective electrical paths of the seventh patterned conductor P7 and the eighth patterned conductor P8 (i.e., the Z-axis direction) and that the jumper chip component 1 extends across the gap W2. The gap W2 may be, for example, narrower than the gap W1 in the third and fourth exemplary uses. The jumper chip component 1 is bonded via solder onto the respective facing end portions of the seventh patterned conductor P7 and the eighth patterned conductor P8 at both ends thereof along the width axis thereof and on both sides of the longitudinal axis thereof (see solder fillets 102).

As a result, the seventh patterned conductor P7 and the eighth patterned conductor P8 are electrically connected to each other via the jumper chip component 1.

In this fifth exemplary use, not only the conductor 3 but also the end face electrode 4 may serve as the current path, thus more significantly reducing the generation of heat as the Joule heat even when a large amount of current is applied.

Second Embodiment

Figure 4:
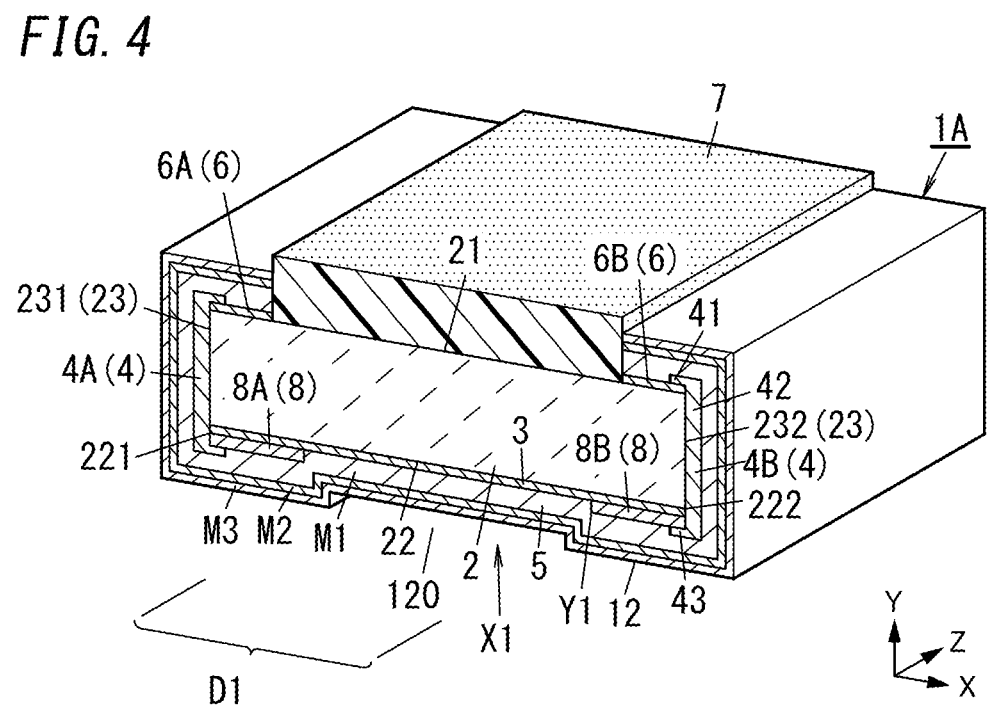

Next, a jumper chip component 1A according to a second exemplary embodiment will be described with reference to FIGS. 4 and 5. In the following description, any constituent element of this jumper chip component 1A, having substantially the same function as a counterpart of the jumper chip component 1 according to the first embodiment described above, will be designated by the same reference numeral as that counterpart's, and description thereof will be omitted herein as appropriate.

Figure 5:
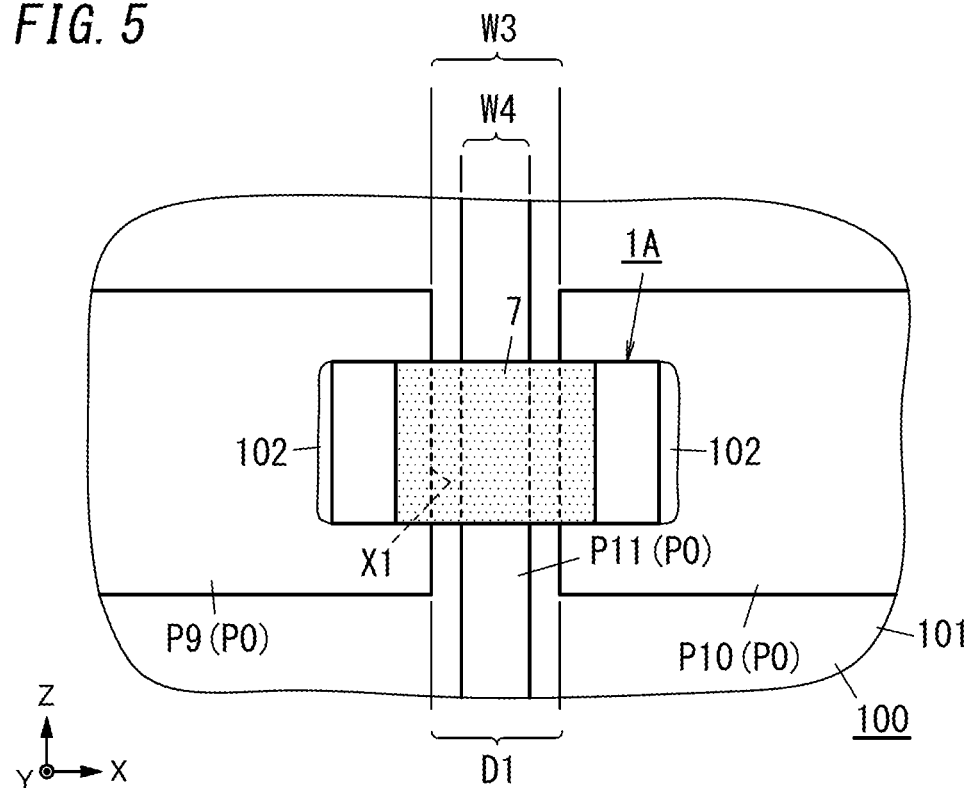
FIG. 5 is a plan view illustrating an exemplary use of the jumper chip component.

The jumper chip component 1A according to this embodiment is to be mounted onto the printed board 100 (refer to FIG. 5). As shown in FIG. 4, the jumper chip component 1A includes the base 2, the conductor 3, the end face electrode 4, and a step providing electrode 8. In addition, the jumper chip component 1A further includes the first plating layer M1 (copper plating layer 5), the upper surface electrode 6, the protective coating 7, the second plating layer M2, and the third plating layer M3 as shown in FIG. 4.

The base 2 has electrical insulation properties. The conductor 3 is disposed on the lower surface 22, facing the printed board 100, of the base 2 to extend from the first end 221 of the lower surface 22 through the second end 222 thereof that faces the first end 221. The end face electrode 4 is disposed on at least the side surfaces 23 of the base 2 and arranged to be electrically connected to the conductor 3. The step providing electrode 8 is an electrode for providing a step Y1. One surface 12, facing the printed board 100, of the jumper chip component 1A has a recess X1 in a central area 120 thereof. The recess X1 is recessed toward the conductor 3. The recess X1 is provided by the step Y1.

In short, the jumper chip component 1A includes the step providing electrode 8 and the recess X1 is provided by the step providing electrode 8 in the central area 120 of the one surface 12, which is a difference from the jumper chip component 1 according to the first embodiment.

Next, the step providing electrode 8 will be described in further detail.

The step providing electrode 8 is disposed under (i.e., on the negative side of the Y-axis) the lower surface 22 of the base 2. The step providing electrode 8 is provided on the lower surface of the conductor 3 and covers the lower surface of the conductor 3 at least partially. In this embodiment, the step providing electrode 8 includes a pair of electrodes 8A, 8B. Each of these electrodes 8A, 8B has the shape of a rectangular strip, which is elongate in the Z-axis direction. These electrodes 8A, 8B are provided directly on the lower surface of the conductor 3 to cover one end portion of the lower surface of the conductor 3 on the negative side of the X-axis and the other end portion of the lower surface of the conductor 3 on the positive side of the X-axis, respectively.

The step providing electrode 8 may be formed as a thin sheet by, for example, printing and firing a conductive paste including silver as a main component. Alternatively, the step providing electrode 8 may also be formed by applying and curing a resin silver paste. The material for the step providing electrode 8 may be the same as the material for the conductor 3. In the example shown in FIG. 4, the thickness of the step providing electrode 8 is greater than the thickness of the conductor 3. However, this is only an example and should not be construed as limiting. Alternatively, the thickness of the step providing electrode 8 may be equal to or less than the thickness of the conductor 3. Adjusting the thickness of the step providing electrode 8 eventually allows the depth of the recess X1 to be adjusted. In addition, adjusting the width of the step providing electrode 8 eventually allows the lateral width D1 of the recess X1 to be adjusted. The step providing electrode 8 may have a thickness of about 15 µm, for example.

In this embodiment, the electrode 4A of the end face electrode 4 is arranged to surround the edge portion of the electrode 6A on the negative side of the X-axis, the first side surface 231 of the base 2, the edge portion of the conductor 3 on the negative side of the X-axis, and the edge portion of the electrode 8A on the negative side of the X-axis. Likewise, the electrode 4B of the end face electrode 4 is arranged to surround the edge portion of the electrode 6B on the positive side of the X-axis, the second side surface 232 of the base 2, the edge portion of the conductor 3 on the positive side of the X-axis, and the edge portion of the electrode 8B on the positive side of the X-axis. The respective lower parts 43 of the electrodes 4A, 4B may have a thickness (i.e., a dimension as measured in the Y-axis direction) of about 10 µm, for example.

In this embodiment, the first plating layer M1 (copper plating layer 5) is disposed to cover the surface of the electrodes 6A, 6B, the surface of the electrodes 4A, 4B, the surface of the electrodes 8A, 8B, and a part of the surface (exposed through the step providing electrode 8) of the conductor 3 almost entirely.

Therefore, forming the first plating layer M1 by plating process with the step providing electrode 8 already formed on the conductor 3 causes a recess to be formed in a central area of the first plating layer M1 in the X-axis direction due to the presence of the step Y1 provided by the step providing electrode 8. In the same way, a recess is also formed in the central area of the second plating layer M2 and the third plating layer M3, which are stacked in this order on the first plating layer M1, in the X-axis direction due to the presence of the step Y1 provided by the step providing electrode 8. That is to say, a recess X1, which is recessed toward the conductor 3, will be formed in the central area 120 of the one surface 12 of the jumper chip component 1A.

In this embodiment, as well as in the first embodiment, the conductor 3 is also disposed on the lower surface 22 of the base 2 to extend from the first end 221 of the lower surface 22 through the second end 222 thereof. Thus, this makes it easier, in the jumper chip component 1A as a whole, to shorten the length of the current path by the end face electrode 4. Consequently, the jumper chip component 1A achieves the advantage of contributing to reducing the resistance value. Reducing the resistance value enables reducing the generation of heat as the Joule heat even when a large amount of current is applied, thus allowing a larger amount of current to flow. That is why it is easier to mount the jumper chip component 1A even on a current path, through which a large amount of current flows, as in onboard motor cables, for example.

Furthermore, providing the recess X1 on the one surface 12 of the jumper chip component 1A may reduce, when there is a piece of wiring between lands (patterned conductors P0), for example, the chances of the piece of wiring coming into contact with the jumper chip component 1A to cause a short-circuit.

<Exemplary Use>

FIG. 5 illustrates an exemplary use of the jumper chip component 1A. In FIG. 5, a ninth patterned conductor P9, a tenth patterned conductor P10, and an eleventh patterned conductor P11 are illustrated as the patterned conductor P0.

The ninth patterned conductor P9 and the tenth patterned conductor P10 are formed to have their respective electrical paths aligned with the X-axis and to make their respective end portions face each other with a predetermined gap W3 left between themselves. The respective widths of the ninth patterned conductor P9 and the tenth patterned conductor P10 are approximately equal to each other. The width of the jumper chip component 1A is less than the respective widths of the ninth patterned conductor P9 and the tenth patterned conductor P10.

The eleventh patterned conductor P11 is formed in the gap W3 to have its electrical path aligned with the Z-axis. The width W4 of the eleventh patterned conductor P11 is less than the width of the gap W3. In particular, the width W4 of the eleventh patterned conductor P11 is less than the lateral width D1 of the recess X1 on the one surface 12 of the jumper chip component 1A. In the example illustrated in FIG. 5, the lateral width D1 of the recess X1 is approximately equal to the width of the gap W3. However, this is only an example and should not be construed as limiting. Alternatively, the lateral width D1 of the recess X1 may also be different from the width of the gap W3.

The jumper chip component 1A is disposed in respective middle parts along the width axis of these patterned conductors P0 such that the longitudinal axis of the jumper chip component 1A is aligned with the respective electrical paths of the ninth patterned conductor P9 and the tenth patterned conductor P10 (i.e., aligned with X-axis direction) and that the jumper chip component 1A extends across the gap W3. The jumper chip component 1A is bonded via solder onto the respective facing end portions of the ninth patterned conductor P9 and the tenth patterned conductor P10 at both longitudinal ends thereof (see solder fillets 102).

As a result, the ninth patterned conductor P9 and the tenth patterned conductor P10 are electrically connected to each other via the jumper chip component 1A. In addition, in this case, the recess X1 provided on the one surface 12 of the jumper chip component 1A makes it easier for the jumper chip component 1A to avoid contact with the eleventh patterned conductor P11. This reduces the chances of the jumper chip component 1A coming into contact with the eleventh patterned conductor P11 to cause a short-circuit.

Alternatively, the jumper chip component 1A may also be mounted on the printed board 100 as in any of the first to fifth exemplary uses already described for the first embodiment.

(Variations)

Note that the first and second embodiments described above are only exemplary ones of various embodiments of the present disclosure and should not be construed as limiting. Rather, the first and second exemplary embodiments may be readily modified in various manners depending on a design choice or any other factor without departing from the scope of the present disclosure. Next, variations of the first and second embodiments will be enumerated one after another. Note that the variations to be described below may be adopted in combination as appropriate.

In the first and second embodiments described above, the jumper chip component 1, 1A has the shape of a plate which is elongate in one direction (i.e., along the X-axis). However, this is only an exemplary shape of the jumper chip component 1, 1A and should not be construed as limiting. Alternatively, the jumper chip component 1, 1A may also have the shape of a square plate when viewed in the thickness direction (i.e., when viewed along the Y-axis).

In the first and second embodiments described above, the jumper chip component 1, 1A includes the first to third plating layers M1-M3. However, these plating layers are not essential components for the jumper chip component 1, 1A. Rather, at least one of the first to third plating layers M1-M3 may be omitted.

In the first to fifth exemplary uses of the first embodiment and in the exemplary use of the second embodiment described above, the number of the jumper chip component 1, 1A is supposed to be one. Alternatively, a plurality of jumper chip components 1 (or a plurality of jumper chip components 1A) may be arranged aggregately on the patterned conductor P0. For example, in the first exemplary use, two or more jumper chip components 1 may be arranged in close contact with each other along the electrical path of the first patterned conductor P1.

Still alternatively, one or more jumper chip components 1 and one or more jumper chip components 1A may be mounted as a mixture on the single printed board 100.

Furthermore, in the first and second embodiments described above, the conductor 3, the end face electrode 4, and the upper surface electrode 6 are supposed to be formed on the base 2 at mutually different timings. Alternatively, at least two members selected from the group consisting of the conductor 3, the end face electrode 4, and the upper surface electrode 6 may be formed on the base 2 at the same timing. Specifically, for example, the conductor 3 and the end face electrode 4 may be formed collectively out of the same material to have the same thickness.

(Recapitulation)

As can be seen from the foregoing description, a jumper chip component (1) according to a first aspect is designed to be mounted onto a printed board (100). The jumper chip component (1) includes a base (2), a conductor (3), and an end face electrode (4). The base (2) has electrical insulation properties. The conductor (3) is disposed on a lower surface (22) of the base (2) to extend from a first end (221) of the lower surface (22) through a second end (222), facing the first end (221), of the lower surface (22). The lower surface (22) faces the printed board (100). The end face electrode (4) is disposed on at least a side surface (23) of the base (2) and arranged to be electrically connected to the conductor (3). The jumper chip component (1) has one surface (12) facing the printed board (100). The one surface (12) is a flat surface.

According to this aspect, the conductor (3) is disposed on the lower surface (22) of the base (2) to extend from the first end (221) of the lower surface (22) through the second end (222) thereof, thus making it easier to shorten the length of the current path in the jumper chip component (1). Consequently, the jumper chip component (1) achieves the advantage of contributing to reducing the resistance value. In particular, the one surface (12) of the jumper chip component (1) is a flat surface, thus contributing to reducing the height of the jumper chip component (1) with respect to the printed board (100).

A jumper chip component (1A) according to a second aspect is designed to be mounted onto a printed board (100). The jumper chip component (1A) includes a base (2), a conductor (3), an end face electrode (4), and a step providing electrode (8). The base (2) has electrical insulation properties. The conductor (3) is disposed on a lower surface (22) of the base (2) to extend from a first end (221) of the lower surface (22) through a second end (222), facing the first end (221), of the lower surface (22). The lower surface (22) faces the printed board (100). The end face electrode (4) is disposed on at least a side surface (23) of the base (2) and arranged to be electrically connected to the conductor (3). The step providing electrode (8) is arranged to provide a step (Y1). The jumper chip component (1A) has one surface (12) facing the printed board (100). The one surface (12) has a recess (X1) in a central area (120) thereof. The recess (X1) is recessed toward the conductor (3). The recess (X1) is provided by the step (Y1).

According to this aspect, the conductor (3) is disposed on the lower surface (22) of the base (2) to extend from the first end (221) of the lower surface (22) through the second end (222) thereof, thus making it easier to shorten the length of a current path in the jumper chip component (1A). Consequently, the jumper chip component (1A) achieves the advantage of contributing to reducing the resistance value. In particular, providing the recess (X1) may reduce, when there is a piece of wiring between lands, for example, the chances of the piece of wiring coming into contact with the jumper chip component (1A) to cause a short-circuit.

A jumper chip component (1, 1A) according to a third aspect, which may be implemented in conjunction with the first or second aspect, further includes a copper plating layer (5) arranged to cover the conductor (3) at least partially.

This aspect may further reduce the resistance value of the jumper chip component (1, 1A).

A jumper chip component (1, 1A) according to a fourth aspect, which may be implemented in conjunction with any one of the first to third aspects, further includes an upper surface electrode (6) disposed on at least a part of an upper surface (21) of the base (2). The upper surface (21) is opposite from the lower surface (22).

This aspect makes the jumper chip component (1, 1A) significantly more resistant to stress after the jumper chip component (1, 1A) has been mounted on the printed board (100).

A jumper chip component (1, 1A) according to a fifth aspect, which may be implemented in conjunction with any one of the first to fourth aspects, further includes a protective coating (7) that covers at least a part of an upper surface (21) of the base (2). The upper surface (21) is opposite from the lower surface (22).

This aspect makes it easier to distinguish the upside of the jumper chip component (1, 1A) from the downside thereof, thus contributing to increasing the productivity.

Note that the constituent elements according to the third to fifth aspects are not essential constituent elements for the jumper chip component (1) according to the first aspect or the jumper chip component (1A) according to the second aspect but may be omitted as appropriate.

REFERENCE SIGNS LIST

1, 1A Jumper Chip Component
12 One Surface
120 Central Area
2 Base
21 Upper Surface
22 Lower Surface
221 First End
222 Second End
23 Side Surface
3 Conductor
4 End Face Electrode
43 Lower Part
Copper Plating Layer
6 Upper Surface Electrode
7 Protective Coating
8 Step Providing Electrode
100 Printed Board
X1 Recess
Y1 Step

The invention claimed is:

1. A jumper chip component to be mounted onto a printed board, the jumper chip component comprising:
   a base having electrical insulation properties;
   a conductor disposed on a lower surface of the base to extend from a first end of the lower surface through a second end, facing the first end, of the lower surface, the lower surface facing the printed board;
   an end face electrode disposed on at least a side surface of the base and arranged to be electrically connected to the conductor; and
   a step providing electrode including a pair of electrodes respectively covering a first area and a second area of a lower surface of the conductor, the first area being on a side of the first end, the second area being on a side of the second end, and the step providing electrode being arranged to provide a step between each of the pair of electrodes and the conductor, wherein:
   the end face electrode includes a lower part, the end face electrode being disposed such that the lower part partially covers the step providing electrode,
   the jumper chip component comprises one surface facing the printed board, the one surface having a recess in a central area of the one surface, the recess being recessed toward the conductor,
   the recess is provided by the step, and
   the recess comprises a lateral width defined based on widths of the pair of electrodes.

2. The jumper chip component of claim 1, further comprising a copper plating layer arranged to cover the conductor at least partially.

3. The jumper chip component of claim 2, further comprising an upper surface electrode disposed on at least a part of an upper surface of the base, the upper surface being opposite from the lower surface of the base.

4. The jumper chip component of claim 3, further comprising a protective coating that covers at least a part of an upper surface of the base, the upper surface being opposite from the lower surface of the base.

5. The jumper chip component of claim 2, further comprising a protective coating that covers at least a part of an upper surface of the base, the upper surface being opposite from the lower surface of the base.

6. The jumper chip component of claim 1, further comprising an upper surface electrode disposed on at least a part of an upper surface of the base, the upper surface being opposite from the lower surface of the base.

7. The jumper chip component of claim 6, further comprising a protective coating that covers at least a part of an upper surface of the base, the upper surface being opposite from the lower surface of the base.

8. The jumper chip component of claim 1, further comprising a protective coating that covers at least a part of an upper surface of the base, the upper surface being opposite from the lower surface of the base.

9. The jumper chip component of claim 1, wherein
   the end face electrode includes a pair of electrodes respectively disposed on a first side surface and a second side surface of the base, the first side surface being a side surface of the first end of the base, and the second side surface being a side surface of the second end of the base,
   the pair of electrodes of the end face electrode respectively includes lower parts, the lower parts being disposed to respectively cover edge portions of the pair of electrodes of the step providing electrode,
   the pair of electrodes of the step providing electrode respectively includes exposed portions that are exposed from the lower parts, and
   the step is provided between the conductor and each of the exposed portions.

* * * * *